(12) United States Patent
Hiramatsu et al.

(10) Patent No.: US 11,052,638 B2
(45) Date of Patent: Jul. 6, 2021

(54) METAL-CLAD LAMINATE AND MANUFACTURING METHOD FOR SAME

(71) Applicant: KURARAY CO., LTD., Kurashiki (JP)

(72) Inventors: Shinji Hiramatsu, Kamisu (JP); Takahiro Nakashima, Kamisu (JP); Tatsuya Sunamoto, Chiyoda-ku (JP); Shigeaki Suzuki, Chiyoda-ku (JP)

(73) Assignee: KURARAY CO., LTD., Kurashiki (JP)

( * ) Notice: Subject to any disclaimer, the term of this patent is extended or adjusted under 35 U.S.C. 154(b) by 234 days.

(21) Appl. No.: 16/082,087

(22) PCT Filed: Mar. 2, 2017

(86) PCT No.: PCT/JP2017/008324
§ 371 (c)(1),
(2) Date: Sep. 4, 2018

(87) PCT Pub. No.: WO2017/150678
PCT Pub. Date: Sep. 8, 2017

(65) Prior Publication Data
US 2020/0290315 A1    Sep. 17, 2020

(30) Foreign Application Priority Data

Mar. 3, 2016 (JP) .............................. JP2016-041591

(51) Int. Cl.
*C09K 19/38* (2006.01)
*B32B 15/08* (2006.01)
(Continued)

(52) U.S. Cl.
CPC .............. *B32B 15/08* (2013.01); *B32B 15/20* (2013.01); *C09K 19/38* (2013.01); *C23C 14/20* (2013.01);
(Continued)

(58) Field of Classification Search
CPC ...... C09K 19/38–3895; C09K 2219/11; H05K 1/0313–0373
See application file for complete search history.

(56) References Cited

U.S. PATENT DOCUMENTS

2004/0124405 A1* 7/2004 Sethumadhavan .... C09K 19/38
257/1
2008/0107833 A1 5/2008 Onodera et al.
(Continued)

FOREIGN PATENT DOCUMENTS

CN 101056758 A 10/2007
CN 103221213 A 7/2013
(Continued)

OTHER PUBLICATIONS

Extended European Search Report dated Dec. 21, 2018 in European Patent Application No. 17760141.6, 8 pages.
(Continued)

*Primary Examiner* — Jeremy C Norris
(74) *Attorney, Agent, or Firm* — Oblon, McClelland, Maier & Neustadt, L.L.P.

(57) ABSTRACT

A metal-clad laminate (1) includes a thermoplastic liquid crystal polymer film (2), a metal deposition layer (4) formed on one surface of the thermoplastic liquid crystal polymer film (2), and metal foil (6) laminated to the other surface of the thermoplastic liquid crystal polymer film (2).

8 Claims, 2 Drawing Sheets

(51) Int. Cl.

| | | |
|---|---|---|
| *B32B 15/20* | (2006.01) | |
| *C23C 14/20* | (2006.01) | |
| *C23C 14/28* | (2006.01) | |
| *C23C 28/02* | (2006.01) | |
| *C25D 3/38* | (2006.01) | |
| *C25D 5/56* | (2006.01) | |
| *H05K 1/03* | (2006.01) | |
| *H05K 3/46* | (2006.01) | |

(52) U.S. Cl.
CPC ............ *C23C 14/28* (2013.01); *C23C 28/023* (2013.01); *C25D 3/38* (2013.01); *C25D 5/56* (2013.01); *H05K 1/0353* (2013.01); *H05K 3/4644* (2013.01); *B32B 2255/10* (2013.01); *B32B 2255/205* (2013.01); *B32B 2307/734* (2013.01); *B32B 2457/08* (2013.01); *H05K 2201/0141* (2013.01)

(56) References Cited

U.S. PATENT DOCUMENTS

| | | |
|---|---|---|
| 2009/0314525 A1 | 12/2009 | Kajino et al. |
| 2010/0323210 A1 | 12/2010 | Onodera et al. |
| 2013/0052336 A1 | 2/2013 | Miyakoshi et al. |
| 2013/0252019 A1 | 9/2013 | Sakaguchi et al. |
| 2017/0208680 A1* | 7/2017 | Fukuchi ................ H05K 3/06 |
| 2018/0134025 A1* | 5/2018 | Nakashima ......... B32B 38/0036 |

FOREIGN PATENT DOCUMENTS

| | | |
|---|---|---|
| JP | 5-42603 A | 2/1993 |
| JP | 9-174786 A | 7/1997 |
| JP | 2001-239585 A | 9/2001 |
| JP | 2002-20513 A | 1/2002 |
| JP | 2007-158017 A | 6/2007 |
| JP | 2010-165877 A | 7/2010 |
| JP | 2013-63649 A | 4/2013 |
| JP | 2014-160738 A | 9/2014 |
| JP | 2015-81373 A | 4/2015 |
| JP | 2016-215458 A | 12/2016 |
| KR | 10-2002-0071784 A | 9/2002 |

OTHER PUBLICATIONS

International Search Report dated May 23, 2017, in PCT/JP2017/008324 filed Mar. 2, 2017.
European Search Report dated Sep. 18, 2020 in Patent Application No. 20184887.6, 6 pages.

* cited by examiner

METAL-CLAD LAMINATE AND MANUFACTURING METHOD FOR SAME

TECHNICAL FIELD

The present invention relates to metal-clad laminates using a film made of a thermoplastic polymer that can form an optically anisotropic melt phase (hereinafter this thermoplastic polymer is referred to as the "thermoplastic liquid crystal polymer" and this film is referred to as the "thermoplastic liquid crystal polymer film) and having a meta deposition film formed on the thermoplastic liquid crystal polymer film, and manufacturing methods of the same.

BACKGROUND ART

With a recent increase in communication speed and capacity of communication devices such as smartphones or tablets, reduction in electrical signal loss, finer pitch circuit patterns, and accurate formation of fine circuits are desired for circuit boards for use in such communication devices.

A semi-additive process and a subtractive process are used to form circuits on flexible printed circuit boards. The subtractive process is a process of forming a circuit by masking copper foil on a resin substrate with an etching resist, etching away the copper foil other than a circuit portion, and then removing the etching resist. The subtractive process is a widely used circuit formation method because a large area can be processed at a time, and it is relatively easy to manage chemical solutions. However, since etching of copper proceeds not only in the thickness direction but also in the lateral direction of the circuit, the circuit has a trapezoidal section. Accordingly, strict control of the circuit width and formation of fine circuits are limited, and it is difficult to form a fine circuit having a finer pitch circuit pattern with high accuracy. The semi-additive process is a process of forming a seed layer by electrolytic copper plating, vapor deposition, sputtering, etc. to form a circuit only in a required portion. In this process, a metal thin film serving as a seed layer is formed on a film by sputtering etc., a resist pattern is formed on this film, and a circuit layer is then grown by electrolytic copper plating. Thereafter, the resist is removed and the seed layer between the circuit layers is etched away, whereby a circuit board is completed. In the semi-additive process, a plating layer grows only in the thickness direction in the resist openings in the plating process. A circuit pattern with a rectangular section can be formed with a desired plating thickness. In the semi-additive process, the circuit width is determined by accuracy of resist photolithography, and a fine circuit can be formed with high accuracy. It can therefore be said that the semi-additive process that can improve circuit width accuracy is a circuit formation method having better impedance control and suitable for high-speed transmission applications, as compared to the subtractive process.

Thermoplastic liquid crystal polymer films with low moisture absorption, high heat resistance, high chemical resistance, and excellent dielectric properties, etc. have drawn attention as an insulating film, and a method for manufacturing a metal-clad laminate by pressure-bonding a thermoplastic liquid crystal polymer film and metal foil with rolls under certain temperature conditions is disclosed (see, e.g., Patent Document 1).

Depositing a conductor metal on an insulating film is proposed as a method for forming a conductive layer on an insulating film. For example, a method is proposed in which a metal is deposited on an insulating film to form a deposition film, the deposition film is then plated with a metal to form a metal layer (conductive layer), and thereafter a circuit pattern is formed in the conductive layer to produce a circuit board. This deposition method can reduce the thickness of the metal layer formed by deposition, and is therefore advantageous as a fine circuit pattern can be formed therein with high accuracy.

For example, another method is also proposed in which a metal thin film is deposited on a liquid crystal polymer film by a vacuum deposition process, a metal deposition film is then formed by an electrolytic plating process, and thereafter a heat treatment is performed. In the case where a metal deposition film is formed by deposition and plating, the thickness of the metal deposition film can be reduced, whereby a fine pitch circuit pattern can be formed. The metal deposition film that is formed by deposition and plating has low surface roughness. This is advantageous in that this metal deposition film has excellent high frequency characteristics (see, e.g., Patent Document 2).

CITATION LIST

Patent Document

PATENT DOCUMENT 1: Japanese Unexamined Patent Publication No. H05-42603
PATENT DOCUMENT 2: Japanese Unexamined Patent Publication No. 2010-165877

SUMMARY OF THE INVENTION

Technical Problem

Dimensional stability of an insulating film is important for circuit boards for which a fine pitch pattern is required. For example, a typical circuit board with micro strip lines is manufactured as follows. In a double-sided metal-clad laminate having a metal layer on both surfaces of an insulating film, a circuit pattern is formed by etching the metal layer on one surface of the double-sided metal-clad laminate, and a coverlay for protecting the circuit pattern is then laminated thereto. However, if the insulating film has poor dimensional stability, the dimensions change during the etching process, and especially a dimensional change in the coverlay lamination process in which a heat press process is performed under high temperature conditions (e.g., at 150° C. for about 30 minutes) is disadvantageous.

Accordingly, even if a metal layer in which a fine circuit pattern is formed with high accuracy is formed by the manufacturing method of a metal-clad laminate described in Patent Document 2, a fine pitch circuit pattern may not be able to be formed due to the dimensional change of the liquid crystal polymer film itself.

In the manufacturing method of a metal-clad laminate described in Patent Document 2, it is necessary to reduce the crystal size of the deposition film in order to improve adhesion strength. However, in order to reduce the crystal size of the deposition film (to less than 0.1 µm), it is necessary to increase the degree of vacuum and reduce the processing rate. Moreover, since heat treatment is required after formation of the metal deposition film, the manufacturing process is complicated, and making it difficult to easily improve adhesion strength between the liquid crystal polymer film and the metal deposition film.

The present invention was made in view of the above problems, and it is an object of the present invention to provide a metal-clad laminate with a metal deposition layer, which has high dimensional stability and high adhesion strength between a thermoplastic liquid crystal polymer film and a metal deposition film.

Solution to the Problem

In order to achieve the above object, a metal-clad laminate of the present invention is characterized by including: a thermoplastic liquid crystal polymer film; a metal deposition layer formed on one surface of the thermoplastic liquid crystal polymer film; and metal foil laminated to the other surface of the thermoplastic liquid crystal polymer film.

A manufacturing method of a metal-clad laminate of the present invention is characterized by including: laminating metal foil to one surface of a thermoplastic liquid crystal polymer film to form a single-sided metal-clad laminate including the metal foil; and forming a metal deposition layer on the other surface of the thermoplastic liquid crystal polymer film by using a deposition system including a heating roll, while moving the single-sided metal-clad laminate by a roll-to-roll process.

Advantages of the Invention

According to the present invention, a metal-clad laminate can be provided which has high dimensional stability and high adhesion strength between a thermoplastic liquid crystal polymer film and a metal deposition film.

DESCRIPTION OF EMBODIMENTS

An embodiment of the present invention will be described in detail below with reference to the accompanying drawings. The present invention is not limited to the following embodiment.

Figure 1:
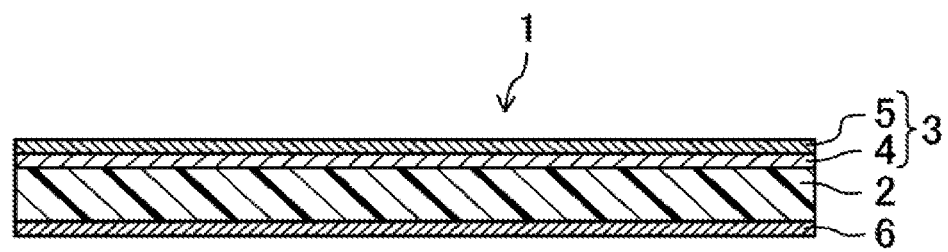
FIG. 1 is a sectional view showing the structure of a metal-clad laminate according to an embodiment of the present invention.

FIG. 1 is a sectional view showing the structure of a metal-clad laminate according to an embodiment of the present invention.

As shown in FIG. 1, a metal-clad laminate 1 of the present embodiment is formed by a thermoplastic liquid crystal polymer film 2, a metal layer 3 formed on one surface of the thermoplastic liquid crystal polymer film 2, and metal foil 6 laminated to the other surface of the thermoplastic liquid crystal polymer film 2 (i.e., the opposite surface from the metal layer 3).

<Metal Layer>

The metal layer 3 of the present invention is formed by a metal deposition layer 4 and a metal plating layer 5 formed on the surface of the metal deposition layer 4.

The metal deposition layer 4 is not particularly limited. For example, copper, gold, silver, nickel, aluminum, stainless steel, etc. may be used. Copper, silver, and gold are preferable in terms of conductivity, ease of handling, cost, etc.

The thickness of the metal deposition layer 4 is preferably 0.1 μm or more and 0.5 μm or less, and more preferably 0.2 μm or more and 0.4 μm or less. This is because a thin metal deposition layer 4 may be disadvantageous as the metal deposition layer 4 may be broken by a current flowing therein when forming the metal plating layer 5 thereon, and a thick metal deposition layer 4 is disadvantageous as it takes a long time to form the deposition layer and such a long deposition time results in reduction in productivity and a significant increase in cost.

The crystal grain size of the metal forming the metal deposition layer 4 is not particularly limited, but is preferably 1.0 μm or more in terms of production efficiency.

The thickness of the metal plating layer 5 is preferably 2 μm or more and 18 μm or less, more preferably 5 μm or more and 16 μm or less, and particularly preferably 8 μm or more and 14 μm or less.

The thickness of the metal layer 3 after plating is preferably 1 μm or more and 200 μm or less, and more preferably 3 μm or more and 20 μm or less. If the thickness of the metal layer 3 is less than 1 μm, the metal layer 3 is too thin and a circuit may be broken due to the small thickness of the metal foil when a large current is applied in the manufacturing process of the metal-clad laminate 1. If the thickness of the metal layer 3 is more than 200 μm, the metal layer 3 is too thick and the metal-clad laminate 1 has poor bending performance when used as, e.g., a flexible circuit board, and it takes time to perform plating, which results in an increase in cost. The metal layer 3 having an appropriate thickness is therefore desired.

<Metal Foil>

The metal foil 6 of the present invention is not particularly limited. For example, copper, gold, silver, nickel, aluminum, stainless steel, etc. may be used. Copper foil and stainless steel foil are preferable in terms of conductivity, ease of handling, cost, etc. Copper foil that can be used herein is copper foil that is produced by a rolling process or an electrolytic process.

The metal foil 6 may have been subjected to a chemical treatment that is typically performed on copper foil, such as pickling. The thickness of the metal foil 6 is preferably 2 μm or more and 18 μm or less, and in terms of ease of handling and resistance to wrinkling, more preferably 6 μm or more and 16 μm or less.

If the thickness of the metal foil 6 is less than 2 μm, the metal foil 6 is too thin and the metal foil 6 may be deformed such as wrinkled in the manufacturing process of the metal-clad laminate 1. If the thickness of the metal foil 6 is more than 18 μm, the metal foil 6 is too thick and the metal-clad laminate 1 may have poor bending performance when used as, e.g., a flexible circuit board.

In the present invention, surface roughness of the metal foil 6 is not particularly limited. Metal foil with ten-point mean roughness Rz of 0.5 μm or more and 3.0 μm or less is preferable particularly in terms of the balance between high frequency characteristics and adhesion strength.

Typically, the lower the ten-point mean roughness Rz of the metal foil 6 is, the better the high frequency characteristics tend to be, but the lower the adhesion strength between the metal foil and the film which have been pressure-bonded tends to be. On the other hand, the higher the ten-point mean roughness Rz is, the poorer the high frequency characteristics tend to be, but the higher the adhesion strength between the metal foil and the insulating film tends to be.

The metal foil 6 of the present invention serves as both a support for the thermoplastic liquid crystal polymer film and a conductive layer, Rz of the metal foil 6 can be set as appropriate according to required performance. In particular, in the case where the metal foil 6 is a ground layer for a microstrip line, the adhesion strength is given priority and the metal foil 6 having Rz of 1.5 μm or more and 2.5 μm or less is preferably used. In the case where great high frequency characteristics are required for the metal foil 6, Rz is preferably 2.0 μm or less, more preferably 1.5 μm or less, and even more preferably 1.1 μm or less, in terms of the balance between high frequency characteristics and adhesion strength.

In the present invention, in the case where copper foil is used as the metal foil 6, copper foil may be rolled foil or electrolytic foil. Typically, rolled foil has lower surface roughness Rz than electrolytic foil (typical rolled foil has Rz of about 1.0 μm). Rolled foil is more advantageous in terms of insertion loss, but in terms of cost, electrolytic foil is more preferable as it is less expensive. In the case where a microstrip line (a transmission line structured to have conductor foil as a ground plane on one surface of an insulating film and a linear circuit pattern as a signal plane on the other surface thereof) is formed by using the metal-clad laminate 1 of the present invention, the metal deposition layer with lower insertion loss is used as a signal plane, and less expensive electrolytic foil is used as a ground plane, whereby a low-cost microstrip line with low insertion loss can be formed.

As used herein, the term "surface roughness" refers to the ten-point mean roughness (Rz) of a metal foil surface as measured with a contact-type surface roughness tester (made by Mitutoyo Corporation, Model: SJ-201) and refers to roughness of one of the surfaces of the metal foil 6 which contacts the thermoplastic liquid crystal polymer film 2.

Surface roughness is measured by a method in accordance with ISO 4287-1997. More specifically, surface roughness (Rz) is calculated as follows. A reference length is extracted from a roughness curve in the direction of its mean line. The difference between the average height of the five highest peaks (convex curves) and the average depth of the five deepest valleys (concave curves), which is expressed in micrometers (μm), represents ten-point mean roughness.

<Thermoplastic Liquid Crystal Polymer Film>

The material of the thermoplastic liquid crystal polymer film 2 of the present invention is not particularly limited. Examples of the material include known thermotropic liquid crystal polyesters and known thermotropic liquid crystal polyester amides which are derived from compounds classified into (1) to (4) shown below and their derivatives. It should be understood that, in order to obtain a polymer that can form an optically anisotropic melt phase, the material compounds should be combined in appropriate proportions.

(1) Aromatic or aliphatic dihydroxy compounds (see Table 1 for representative examples)

TABLE 1

Chemical Structural Formulas of Representative Examples of
Aromatic or Aliphatic Dihydroxy Compounds

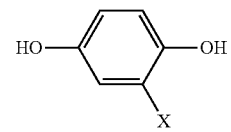

(X represents a hydrogen atom, a halogen atom, or a group such as a lower alkyl group or a phenyl group)

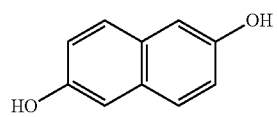

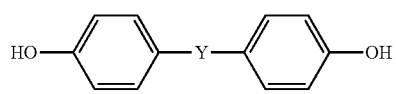

(Y represents a group such as —O—, —CH$_2$—, or —S—)

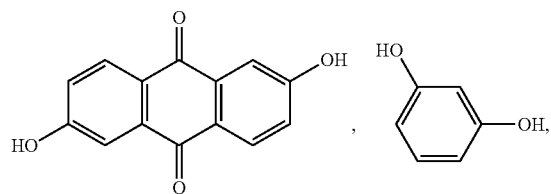 [SMILES: O=C1c2ccc(O)cc2C(=O)c2ccc(O)cc21 ; Oc1cccc(O)c1]

HO(CH$_2$)$_n$OH          (n represents an integer of 2 to 12)

(2) Aromatic or aliphatic dicarboxylic acids (see Table 2 for representative examples)

TABLE 2

Chemical Structural Formulas of Representative Examples of Aromatic or Aliphatic Dicarboxylic Acids

HOOC—⟨C₆H₄⟩—COOH,

HOOC—⟨naphthalene⟩—COOH,

HOOC—⟨C₆H₄⟩—⟨C₆H₄⟩—COOH, HOOC—⟨C₆H₄⟩—O—⟨C₆H₄⟩—COOH,

HOOC—⟨C₆H₄⟩—OCH₂CH₂O—⟨C₆H₄⟩—COOH,

⟨C₆H₄⟩(HOOC)(COOH) (meta),

HOOC(CH₂)$_n$COOH  (n represents an integer of 2 to 12)

(3) Aromatic hydroxycarboxylic acids (see Table 3 for representative examples)

TABLE 3

Chemical Structural Formulas of Representative Examples of Aromatic Hydroxycarboxylic Acids HO—⟨C₆H₃(X)⟩—COOH  (X represents a hydrogen atom, a halogen atom, or a group such as a lower alkyl group or a phenyl group)

HO—⟨naphthalene⟩—COOH,  HO—⟨C₆H₄⟩—⟨C₆H₄⟩—COOH,  ⟨C₆H₄⟩(HO)(COOH)

(4) Aromatic diamines, aromatic hydroxylamines, or aromatic aminocarboxylic acids (see Table 4 for representative examples)

TABLE 4

Chemical Structural Formulas of Representative Examples of Aromatic Diamines, Aromatic Hydroxylamines, or Aromatic Aminocarboxylic Acids

H₂N—⟨C₆H₄⟩—NH₂,  H₂N—⟨C₆H₄⟩—OH,  H₂N—⟨C₆H₄⟩—COOH

Representative examples of thermoplastic liquid crystal polymers obtained from these material compounds include copolymers (a) to (e) having structural units shown in Table 5

TABLE 5

Representative Examples of Thermoplastic Liquid Crystal Polymers (a) —[OC—⌬—CO]— —[OCH₂CH₂O]— —[OC—⌬—O]— Copolymers (b) —[O—⌬—CO]— [O—naphthalene—CO]— Copolymers (c) —[O—⌬—CO]— —[OC—⌬—CO]— [OC—⌬—CO]— —[O—⌬—⌬—O]— Copolymers (d) [O—naphthalene—CO]— —[OC—⌬—CO]— —[O—⌬—NH]— Copolymers (e) —[O—⌬—CO]— —[OC—⌬—CO]— —[O—⌬—⌬—O]— —[O—⌬—X—⌬—O]— Copolymers (X represents a group such as —O—, —CH₂—, or —S—)

The thermoplastic liquid crystal polymer that is used in the present invention preferably has a melting point (hereinafter referred to as "Mp") in the range of about 200 to about 400° C., particularly in the range of about 250 to about 350° C., in order to provide desired heat resistance and workability to the film, but preferably has a relatively low melting point in terms of film formation.

Accordingly, in the case where higher heat resistance or a higher melting point is required, the formed film can be heat-treated to have desired heat resistance or a desired melting point. As an example of heat treatment conditions, even if the formed film has a melting point of 283° C., the melting point is increased to 320° C. by heating the formed film at 260° C. for five hours.

Mp can be obtained by measuring with a differential scanning calorimeter (made by SHIMADZU CORPORATION, trade name: DSC) the temperature at which a main endothermic peak appears.

The thermoplastic liquid crystal polymer film 2 of the present invention is formed by extrusion molding of the polymer described above. Although any extrusion molding method can be used, well-known methods such as a T-die film forming and stretching method, a laminate stretching method, and an inflation method are industrially advantageous. Particularly with the inflation method, stress is applied not only in the direction of the mechanical axis of the film (the longitudinal direction of the film) (hereinafter referred to as the "MD direction"), but also in the direction perpendicular to the MD direction (hereinafter referred to as the "TD direction"). A film thus formed is well-balanced between mechanical properties and thermal properties in the MD direction and the TD direction.

The thermoplastic liquid crystal polymer film 2 of the present embodiment preferably has a segment orientation ratio (SOR) in the longitudinal direction of the film of 0.90 or more and less than 1.20, more preferably 0.95 or more and 1.15 or less, and even more preferably 0.97 or more and 1.15 or less.

The thermoplastic liquid crystal polymer film 2 having a segment orientation ratio in this range is satisfactorily balanced between mechanical properties and thermal properties in the MD direction and the TD direction. Such a thermoplastic liquid crystal polymer film 2 is advantageous not only in that it is highly practical but also in that, as described above, it provides satisfactory isotropy and dimensional stability to the metal-clad laminate 1 for circuit boards.

If the segment orientation ratio SOR is 0.50 or less or 1.50 or more, the film is hard and is easily torn in the TD or MD direction due to very uneven orientation of liquid crystal polymer molecules. When used for circuit boards for which form stability such as no warping during heating is required, the thermoplastic liquid crystal polymer film 2 needs to have a segment orientation ratio SOR of 0.90 or more and less than 1.15, as described above. Particularly in the case where no warping should occur during heating, the segment orientation ratio SOR is desirably 0.95 or more and 1.08 or less. The film can be made to have a uniform dielectric constant by having the segment orientation ratio of 0.90 or more and 1.08 or less.

As used herein, the term "segment orientation ratio SOR" refers to an index of the degree of orientation of molecules in a molecular segment. Unlike the conventional molecular orientation ratio (MOR), the SOR is a value calculated in view of the thickness of an object.

The segment orientation ratio SOR is calculated as follows.

First, the thermoplastic liquid crystal polymer film 2 is inserted into a microwave resonance waveguide of a well-known microwave molecular orientation ratio measuring apparatus with the film surface being perpendicular to the direction in which microwaves travel, and electric field strength of microwaves having passed through the film is measured.

Next, the m value (which is called the refractive index) is calculated based on the measured value by the following expression (1).

(Expression 1)

$$m=(Z_o/\Delta z)\times[1-\nu max/\nu o] \qquad (1)$$

(where, Zo is an apparatus constant, Δz is an average thickness of an object, ν max is a microwave frequency that provides maximum microwave transmission intensity out of various microwave frequencies, and νo is a microwave frequency that provides maximum microwave transmission intensity when the average thickness is zero (i.e., there is no object).

The segment orientation ratio SOR is then calculated by m0/m90, where m0 is the m value in the case where the rotation angle of the object with respect to the oscillation direction of microwaves is 0°, that is, in the case where the oscillation direction of microwaves is the same as the direction which provides minimum microwave transmission intensity and in which most of the molecules of the object are oriented (usually the longitudinal direction of the film formed by extrusion molding), and m90 is the m value in the case where the rotation angle is 90°.

The thickness of the thermoplastic liquid crystal polymer film 2 of the present invention is not particularly limited. However, in the case where the metal-clad laminate 1 using the thermoplastic liquid crystal polymer film 2 as an electrically insulating material is used as a printed circuit board, the thickness of the thermoplastic liquid crystal polymer film 2 is preferably in the range of 20 to 150 μm, and more preferably in the range of 25 to 100 μm.

If the film is too thin, the film has low rigidity and strength. Accordingly, when electronic components are mounted on a printed circuit board produced with this film, the printed circuit board is deformed by pressure, which reduces wiring position accuracy and causes defects.

A composite material of the thermoplastic liquid crystal polymer film and other electrically insulating material, e.g., a glass substrate, may be used as an electrically insulating material for main circuit boards such as personal computers. The film may contain an additive such as a lubricant or an antioxidant.

The thermoplastic liquid crystal polymer film 2 of the present invention is preferably a film that has sufficient material strength and that undergoes only a small dimensional change during heat treatment in a metal deposition process described below. In view of the above, toughness of the thermoplastic liquid crystal polymer film is preferably 30 to 100 MPa, more preferably 40 to 90 MPa, and even more preferably 60 to 85 MPa.

As used herein, the "toughness of the thermoplastic liquid crystal polymer film" refers to a value calculated by the following expression (2) from elongation and maximum tensile strength measured with a tensile testing machine (A&D Company, Limited, trade name: RTE-210) by a method in accordance with ASTM D882.

(Expression 2)

$$\text{Toughness}=\text{elongation}\times\text{maximum tensile strength}\times\tfrac{1}{2} \qquad (2)$$

The coefficient of thermal expansion of the thermoplastic liquid crystal polymer film is preferably 10 to 30 ppm/°C., more preferably 12 to 25 ppm/°C., and even more preferably 15 to 20 ppm/°C. With the coefficient of thermal expansion in this range, the difference in thermal expansion between the thermoplastic liquid crystal polymer film and the metal foil or the metal deposition layer is reduced. Satisfactory dimensional stability can thus be maintained even during circuit formation etc.

As used herein, the term "coefficient of thermal expansion" is calculated based on a change in length between 30° C. and 150° C. which occurs when a thermoplastic liquid crystal polymer film having a width of 5 mm and a length of 20 mm is heated from room temperature to 200° C. at 5° C./min while a tensile load of 1 g is applied to both ends of the thermoplastic liquid crystal polymer film by using a thermomechanical analyzer (TMA).

The thermoplastic liquid crystal polymer may contain a thermoplastic polymer such as polyethylene terephthalate, modified polyethylene terephthalate, polyolefin, polycarbonate, polyarylate, polyamide, polyphenylene sulfide, polyether ether ketone, or fluororesin, and various additives in such a range that does not affect the advantageous effects of the present invention, and if necessary, may contain a filler.

For example, VECSTAR CT-Z (melting point: 335° C., made by KURARAY CO., LTD.) or VECSTAR CT-F (melting point: 280° C., made by KURARAY CO., LTD.) can be used as the thermoplastic liquid crystal polymer film 2 of the present invention.

A manufacturing method of a metal-clad laminate according to the embodiment of the present invention will be described below.

The manufacturing method of the present embodiment includes a single-sided metal-clad laminate formation process of laminating metal foil to one surface of a thermoplastic liquid crystal polymer film to form a single-sided metal-clad laminate having metal foil, a metal deposition process of forming a metal deposition layer on the other surface of the thermoplastic liquid crystal polymer film by a vacuum deposition process, an electrolytic plating process of forming a metal plating layer on the surface of the metal deposition layer, and a circuit formation process of forming a circuit in the metal plating layer.

<Single-Sided Metal-Clad Laminate Formation Process>

First, with a long thermoplastic liquid crystal polymer film 2 under tension, long metal foil 6 is laminated to one surface of the thermoplastic liquid crystal polymer film 2, and the thermoplastic liquid crystal polymer film 2 and the metal foil 6 are pressure-bonded between heating rolls and laminated.

As used herein, the expression "under tension" refers to the state where a tensile force (e.g., 0.12 to 0.28 kg/mm²) is being applied to the film in the longitudinal direction (stretching direction) of the film.

Figure 2:
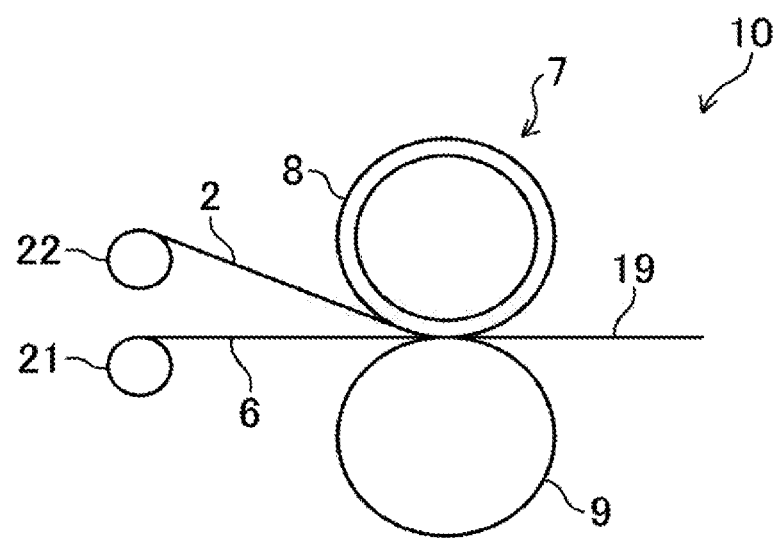
FIG. 2 is a schematic view showing the general configuration of a continuous heat press machine that is used in a manufacturing method of a metal-clad laminate according to the embodiment of the present invention.

FIG. 2 is a schematic view showing the general configuration of a continuous heat press machine that is used in the manufacturing method of a metal-clad laminate according to the embodiment of the present invention.

A continuous heat press machine 10 is a machine for manufacturing a single-sided metal-clad laminate 19 having the metal foil 6 bonded to one surface of the thermoplastic liquid crystal polymer film 2. As shown in FIG. 2, the continuous heat press machine 10 includes an unwind roll 22 having a roll of the thermoplastic liquid crystal polymer film 2 thereon, an unwind roll 21 having a roll of the metal foil 6 such as copper foil thereon, and heating rolls 7 that bond the thermoplastic liquid crystal polymer film 2 and the metal foil 6 by thermocompression bonding to form the single-sided metal-clad laminate 19.

For example, a pair of rolls, namely a heat-resistant rubber roll 8 and a heating metal roll 9 (hardness of the roll surfaces of both rolls is 80 degrees or more), are used as the heating rolls 7 in order to manufacture a single-sided metal-clad laminate. The heat-resistant rubber roll 8 and the metal roll 9 are preferably disposed such that the heat-resistant rubber roll 8 faces the thermoplastic liquid crystal polymer film 2 and the heating metal roll 8 faces the metal foil 6.

Hardness of the roll surface of the heat-resistant rubber roll 8 that is used to manufacture a single-sided metal-clad laminate is preferably 80 degrees or more, and more preferably 80 to 95 degrees, as tested with an A-type spring hardness tester based on JIS K 6301. If the hardness is less than 80 degrees, the resultant single-sided metal-clad laminate 19 does not have sufficient adhesion strength because the pressure that is applied during thermocompression bonding is not high enough. If the hardness is more than 95 degrees, a linear pressure may be locally applied between the heat-resistant rubber roll 8 and the heating metal roll 9, whereby the resultant single-sided metal-clad laminate 19 may have a poor appearance. Rubber with hardness of 80 degrees or more is produced by adding a vulcanizing agent or a vulcanization accelerator such as an alkaline substance to a synthetic rubber such as silicone rubber or fluororubber or a natural rubber.

As shown in FIG. 1, with the thermoplastic liquid crystal polymer film 2 being placed on the metal foil 6, the thermoplastic liquid crystal polymer film 2 and the metal foil 6 are moved in the longitudinal direction of the film and fed between the pair of rolls, namely between the heat-resistant rubber roll 8 and the heating metal roll 9. The thermoplastic liquid crystal polymer film 2 and the metal foil 6 are thus bonded by thermocompression bonding and laminated.

<Metal Deposition Process>

First, an evaporation boat (made of tungsten or molybdenum which serves as a resistor) containing an evaporation source (e.g., Cu of 99% or more purity) is placed in a deposition chamber in a vacuum deposition system. Next, a current is applied to the evaporation boat for heating. A metal is thus deposited on the surface of the thermoplastic liquid crystal polymer film 2, whereby a metal deposition layer 4 is formed on the surface of the thermoplastic liquid crystal polymer film 2 of the single-sided metal-clad laminate 19.

The metal deposition layer 4 may be formed by depositing a metal on the surface of the thermoplastic liquid crystal polymer film 2 by placing the evaporation source in the crucible and irradiating the crucible with an electron beam to heat the evaporation source in a vacuum atmosphere.

In the present embodiment, a roll-to-roll process is used so that the metal deposition layer 4 is formed on the surface of the thermoplastic liquid crystal polymer film 2 while moving the sheet-like thermoplastic liquid crystal polymer film 2 in the deposition chamber.

Figure 3:
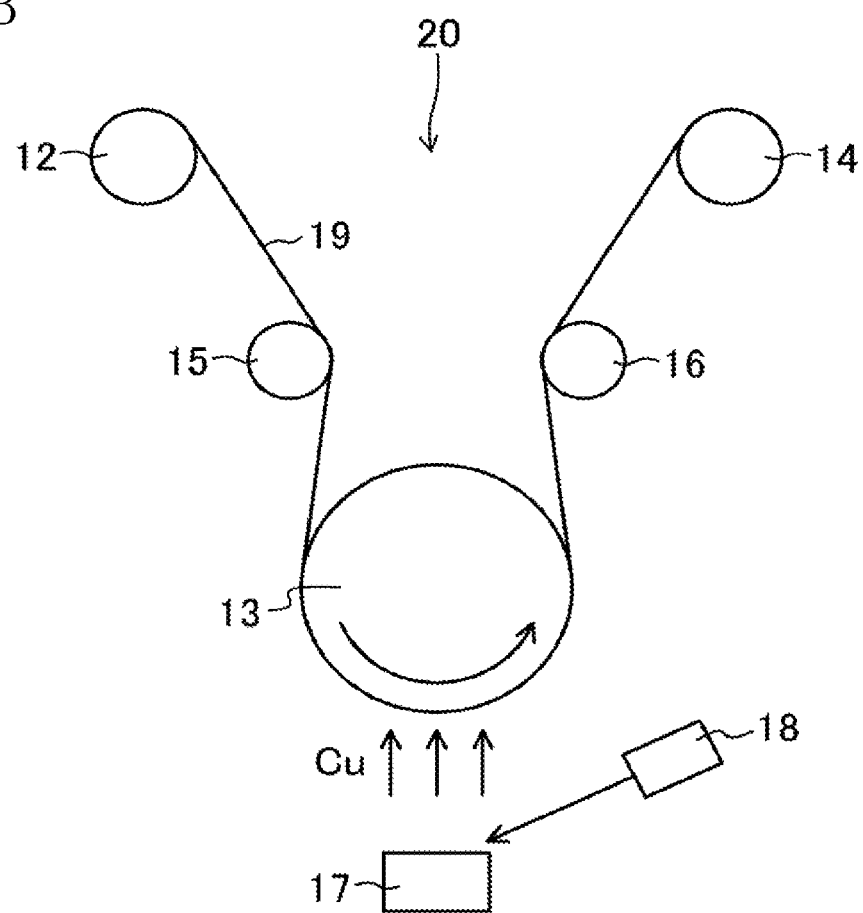
FIG. 3 is a schematic view showing the general configuration of a deposition system that is used in the manufacturing method of a metal-clad laminate according to the embodiment of the present invention.

FIG. 3 is a schematic view showing the general configuration of the deposition system that is used in the manufacturing method of a thermoplastic liquid crystal polymer film having a metal deposition layer thereon according to the embodiment of the present invention.

This deposition system 20 includes an unwind roll 12 having a roll of the single-sided metal-clad laminate 19 thereon, a heating roll 13 for depositing a metal on the surface of the thermoplastic liquid crystal polymer film 2 of the single-sided metal-clad laminate 19 at a predetermined temperature to form the metal deposition layer 4, a take-up roll 14 for winding thereon the single-sided metal-clad laminate 19 with the metal deposition layer 4, and guide rolls 15, 16 for moving the single-sided metal-clad laminate 19 by the roll-to-roll process.

A crucible 17 disposed below the heating roller 13 is irradiated with an electron beam emitted from an electron gun 18 to heat an evaporation source contained in the crucible 17. A metal (e.g., copper) is thus deposited on the surface of the thermoplastic liquid crystal polymer film 2, whereby the metal deposition layer 4 is formed.

In the present invention, based on the melting point Mp of the thermoplastic liquid crystal polymer film, a metal is preferably deposited on the surface of the thermoplastic liquid crystal polymer film 2 at a temperature of (Mp−65°) C. or more and (Mp−40°) C. or less (that is, the temperature of the heating roll 13 is set to (Mp−65°) C. or more and (Mp−40°) C. or less), and more preferably at a temperature of (Mp−60°) C. or more and (Mp−50°) C. or less, to form the metal deposition layer 4.

Setting the heating temperature of the metal deposition process to (Mp−65°) C. or more and (Mp−40°) C. or less increases adhesion between the thermoplastic liquid crystal polymer film 2 and the metal deposition layer 4 and thus improves peel strength. This seems to be because performing deposition at a temperature close to the heat distortion temperature of the thermoplastic liquid crystal polymer film 2 allows evaporated particles (particles scattered when evaporated) to penetrate the film that has been softened by heating and adhesion between the thermoplastic liquid crystal polymer film 2 and the metal deposition layer 4 is thus increased. The size of the particles that penetrate the film is typically about several tens of angstroms and is sufficiently smaller than surface roughness of the film.

Adhesion strength between the thermoplastic liquid crystal polymer film 2 and the metal deposition layer 4 can thus be improved without performing roughening treatment on the surface of the thermoplastic liquid crystal polymer film 2, controlling the crystal size of the metal deposition layer 4, and performing heat treatment after formation of the metal layer 3. The thermoplastic liquid crystal polymer film 2 with the metal deposition layer 4, which has low insertion loss and high adhesion strength, can thus be provided by an inexpensive, simple method.

Since there is no need to control the crystal size of the metal deposition layer 4 to be deposited, the thermoplastic liquid crystal polymer film 2 with the metal deposition layer 4, which has high adhesion strength, can thus be provided efficiently (i.e., without reducing productivity).

In the present invention, deposition is performed while heating the thermoplastic liquid crystal polymer film 2 (e.g., in the above embodiment, while heating the thermoplastic liquid crystal polymer film 2 with the heating roll). The crystal size of the metal deposition layer 4 that is formed by deposition is changed significantly by heating. In the present invention, however, the crystal size of the metal deposition layer 4 is not particularly limited, and can be set to larger than 0.1 µm and 10 µm or less.

In the present embodiment, in order to improve productivity in the roll-to-roll process, it is preferable to set the deposition rate to 1 nm/s or more and 5 nm/s or less.

In the present embodiment, it is preferable to set the speed at which the thermoplastic liquid crystal polymer film 2 is moved in the roll-to-roll process to 0.1 m/min to 5 m/min.

<Electrolytic Plating Process>

Next, a metal plating layer 5 is formed on the surface of the metal deposition layer 4 by using an electrolytic plating method. More specifically, a metal layer 3 comprised of the metal deposition layer 4 and the metal plating layer 5 is formed by electrolytically plating the metal deposition layer (underlying metal film) 4 formed by the above metal deposition process with a metal (e.g., copper).

The electrolytic plating method is not particularly limited. For example, in the case where a copper plating layer is formed as the metal plating layer 5, a common copper sulfate plating process may be used.

The thickness of the metal plating layer 5 is preferably 1 µm or more and 10 µm or less in terms of productivity and the aspect ratio of a circuit. In the case where the metal plating layer 5 is thin, the aspect ratio, as given by the ratio of the upper width to the lower width of the circuit, is close to "1" and a circuit having a sharp shape is formed. In the case where the metal plating layer 5 is thick, the aspect ratio of a circuit is small and a circuit having a trapezoidal shape is formed. A sharp circuit pattern with the aspect ratio close to "1" is desired for millimeter-wave or microwave circuits.

In terms of productivity, it is preferable to set the current density between the anode and the cathode to 0.1 A/dm$^2$ or more and 0.5 A/dm$^2$ or less.

As described above, in the present invention, adhesion strength between the thermoplastic liquid crystal polymer film 2 and the metal layer 3 can be improved. In terms of circuit reliability, however, peal strength between the thermoplastic liquid crystal polymer film 2 and the metal layer 3 is preferably 0.5 kN/m or more, more preferably 0.7 kN/m or more, and even more preferably 0.8 kN/m or more.

As used herein, the term "peel strength" refers to the value of peel strength (kN/m) as measured with a digital force gauge (e.g., made by IMADA CO., LTD., trade name: ZP-500N) by a method in accordance with IPC-TM-650 2.4.3.

<Circuit Formation Process>

In the present invention, a circuit may be formed by a subtractive process or a semi-additive process in the circuit formation process.

In the subtractive process, for example, a circuit can be formed by masking the metal layer 3, which is formed by forming the metal plating layer 5 on the surface of the metal deposition layer 4, with an etching resist, etching away the metal layer 3 other than a portion where the circuit is to be formed, and then removing the etching resist.

In order to form a fine-pitch circuit, it is more preferable to form a circuit by the semi-additive process. In this case, in the metal-clad laminate having the metal deposition layer 4 formed on the thermoplastic liquid crystal polymer film 2, a resist pattern is formed on the metal deposition layer 4 serving as a seed layer, and a circuit layer is then grown by electrolytic copper plating. Thereafter, the resist is removed and the seed layer between the circuit layers is etched away, whereby a circuit pattern is completed. The circuit pattern after the etching process may further be plated to adjust the thickness of the circuit as desired. For example, the thickness of the circuit may be set to 10 µm to 14 µm (e.g., 12 µm).

In the semi-additive process, a metal plating layer grows only in the thickness direction in the resist openings in the electrolytic copper plating process. A circuit pattern with a rectangular section can be formed with a desired plating thickness. In the semi-additive process, the circuit width is determined by accuracy of resist photolithography, and a fine circuit can be formed with high accuracy. It can therefore be said that the semi-additive process that can improve circuit width accuracy is a circuit formation method having better impedance control and suitable for high-speed transmission applications, as compared to the subtractive process.

As described above, in the present invention, the single-sided metal-clad laminate 19 having the metal foil 6 laminated to one surface of the thermoplastic liquid crystal polymer film 2 is formed. By moving the single-sided metal clad laminate 19 by the roll-to-roll process, the metal deposition layer 4 is formed on the other surface of the thermoplastic liquid crystal polymer film 2 which does not have the metal foil 6 laminated thereto. Accordingly, when forming the metal deposition layer 4, the metal foil 6 laminated to the one surface of the thermoplastic liquid crystal polymer film 2 serves to cover thermal strain of the thermoplastic liquid crystal polymer film. Strain of the thermoplastic liquid crystal polymer film 2 is thus restrained and dimensional stability of the thermoplastic liquid crystal polymer film 2 is improved, as compared to a thermoplastic liquid crystal polymer film having no metal foil laminated thereto. As a result, a dimensional change due to strain of the thermoplastic liquid crystal polymer film 2 is restrained in an etching process or a coverlay lamination process in which a heat press process is performed under high temperature conditions, whereby a metal-clad laminate in which a fine pitch circuit pattern can be formed with high accuracy can be obtained.

That is, if a metal deposition layer is formed on a thermoplastic liquid crystal polymer film having no metal foil laminated thereto by the roll-to-roll process, the thermoplastic liquid crystal polymer film is exposed to high temperatures. The thermoplastic liquid crystal polymer film being moved is therefore stretched, causing strain of the thermoplastic liquid crystal polymer film and deteriorating dimensional stability. The strain of the thermoplastic liquid crystal polymer film is therefore released in an etching process or a coverlay lamination process in which a heat press process is performed under high temperature conditions. Accordingly, even if a metal layer in which a fine circuit pattern is formed with high accuracy is formed, a fine pitch circuit pattern may not be able to be formed due to the dimensional change of the liquid crystal polymer film itself.

In the present invention, however, as described above, the metal deposition layer 4 is formed on the single-sided metal-clad laminate 19 having the metal foil 6 laminated thereto. Accordingly, when a tensile force is applied to the thermoplastic liquid crystal polymer film 2 in the roll-to-roll process, the metal foil 6 serves as a support, whereby the possibility of accumulation of thermal strain of the thermoplastic liquid crystal polymer film 2 can be reduced or eliminated even if deposition is performed under high temperature conditions. When forming the metal deposition layer 4, the metal foil 6 can thus restrain thermal strain of the thermoplastic liquid crystal polymer film 2. A dimensional change due to strain of the thermoplastic liquid crystal polymer film 2 can thus be restrained.

Whether strain has occurred in the metal-clad laminate 1 or not can be determined based on the dimensional change between the metal-clad laminate 1 before heating and the metal-clad laminate 1 after heating at 50° C. for 30 minutes.

Figure 4:
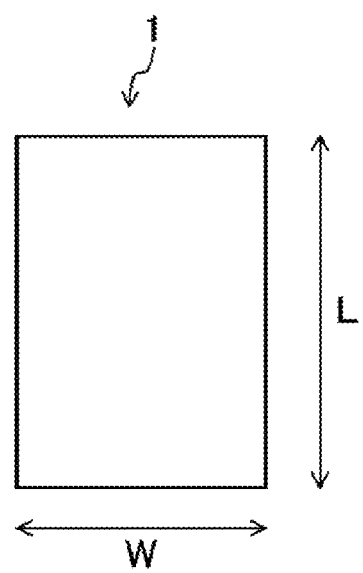
FIG. 4 is a plan view illustrating the longitudinal and lateral directions of the metal-clad laminate according to the embodiment of the present invention.

If the dimensional changes of the metal-clad laminate 1 in the longitudinal direction L and the lateral direction W shown in FIG. 4 are ±0.1% or less, it can be said that strain of the metal-clad laminate 1 has been restrained.

As used herein, the term "dimensional change" refers to the rate of change in dimensions (%) before and after heating of the metal-clad laminate 1 as measured by a method in accordance with IPC-TM-650 2.4.4. by heating at 150° C. for 30 minutes with a hot air circulation dryer.

In the present invention, dimensional stability of the thermoplastic liquid crystal polymer film 2 is improved, as described above. There is no need to set the temperature of the heating roll 13 to a low temperature in order to improve dimensional stability. That is, as described above, since the temperature of the heating roll 13 can be set to a high temperature (i.e., (Mp−65°) C. or more and (Mp−40°) C. or less), adhesion strength between the thermoplastic liquid crystal polymer film 2 and the metal deposition layer 4 can be improved.

EXAMPLES

The present invention will be described below based on examples. The present invention is not limited to these examples. These examples may be altered or modified within the spirit and scope of the present invention, and the alterations and modifications are not excluded from the scope of the present invention.

Example 1

<Production of Single-Sided Copper-Clad Laminate>

First, a thermoplastic liquid crystal polymer film having a thickness of 50 μm (made by KURARAY CO., LTD., trade name: VECSTAR CT-Z) was prepared. Next, the thermoplastic liquid crystal polymer film and electrolytic copper foil having a thickness of 12 μm (made by MITSUI MINING & SMELTING CO., LTD., trade name: 3EC M2S-VLP (surface roughness: 2.0 μm)) were introduced and pressure-bonded between a heat-resistant rubber roll and a heating metal roll of a continuous heat press machine, whereby a single-sided copper-clad laminate was produced.

Surface roughness Rz of the copper foil was calculated by measuring the ten-point mean roughness of a roughened surface with a surface roughness tester (made by Mitutoyo Corporation, trade name: Surftest SJ-201) in accordance with JIS B 0601. Measurement was made ten times under the following conditions with the measurement position being shifted parallel to the rolling direction each time, and the average of the ten measurement values was calculated. Reference length: 0.8 mm, evaluation length: 4 mm, cutoff value: 0.8 mm, and feed speed: 0.5 mm/sec.

A resin-coated metal roll (made by YURI ROLL MACHINE CO., LTD., trade name: Super-Tempex, resin thickness: 1.7 cm) was used as the heat-resistant rubber roll that contacts the thermoplastic liquid crystal polymer film.

The surface temperature of the heating metal roll was set to a temperature that is 20° C. lower than the melting point of the thermoplastic liquid crystal polymer film. The pressure to be applied to the thermoplastic liquid crystal polymer film and the copper foil between the heat-resistant rubber roll and the heating metal roll was set to 120 kg/cm² in surface pressure. Under these conditions, the thermoplastic liquid crystal polymer film was moved along the heat-resistant rubber roll, and the copper foil was then placed on and bonded to the thermoplastic liquid crystal polymer film.

<Formation of Copper Deposition Layer>

Next, a copper deposition layer (thickness: 0.3 μm) was formed on the other surface of the thermoplastic liquid crystal polymer film of the single-sided copper-clad laminate by a roll-to-roll process using a vacuum deposition system (made by ROCK GIKEN KOGYO Co., Ltd., trade name: RVC-W-300).

More specifically, the single-sided copper-clad laminate was set on a loader, and an open window was firmly closed. A deposition chamber was then evacuated to vacuum, and at the same time, the temperature of a heating roll (a roll for depositing a metal on the thermoplastic liquid crystal polymer film) was set to 100° C.

Thereafter, a copper ingot was taken out, and copper pellets were placed so that the total weight of copper was 450 g. As a pretreatment, the copper pellets had been washed with a sodium persulfate solution and then with distilled water.

Subsequently, after confirming that the degree of vacuum in the deposition chamber had reached $7 \times 10^{-3}$ Pa, the temperature of the heating roll was set to 280° C. The output of EMI (an emission current value from an electron gun) was then increased to melt copper. At this time, the EMI output value was adjusted to the deposition rate of 2.7 nm/s.

Subsequently, after confirming that the temperature of the heating roll had reached the set temperature (280° C.) and the degree of vacuum in the deposition chamber had been equal to or less than $5 \times 10^{-3}$ Pa, the speed at which the single-sided copper-clad laminate is moved was set to 0.5 m/min. In this state, copper was deposited to form a copper deposition layer having a thickness of 0.3 μm.

<Appearance Evaluation>

The copper-clad laminate thus produced was visually inspected for wrinkles from the reflection optical axis from the incident optical axis of inspection lighting. The result is shown in Table 6.

<Formation of Copper Layer>

Subsequently, a copper plating layer (thickness: 12 μm) was formed on the surface of the copper deposition layer by electrolytic plating. A copper layer comprised of the copper deposition layer and the copper plating layer and having a thickness of 12.3 μm was thus formed, whereby a copper-clad laminate was produced. The copper plating layer having a thickness of 12 μm was formed in a bath of a high-throw copper sulfate virgin makeup solution (the basic composition of copper sulfate plating containing 40 to 100 g/L of copper sulfate and 150 to 250 g/L of sulfuric acid).

<Dimensional Stability Evaluation>

Next, in accordance with IPC-TM-650 2.2.4, the copper-clad laminate thus produced was heat treated (placed in an oven maintained at 150° C.±2° C. for 30±2 minutes and then left to stand for 24 hours at 23° C.±2° C. and 50%±5 RH) and the dimensional change (%) after the heat treatment to before the heat treatment was measured. The dimensional change refers to the average of the measurement values. The copper-clad laminates having the dimensional changes of 0.1% or less both in the longitudinal direction and in the lateral direction were considered to have satisfactory dimensional stability. The result is shown in Table 6.

<Measurement of Peel Strength>

Peel strength of the copper deposition layer: the copper-clad laminate having its copper deposition surface plated was used to produce peel test pieces with a width of 1.0 cm. The thermoplastic liquid crystal polymer film was then fixed to a flat plate with a double-sided adhesive tape, and the copper deposition layer (copper layer) was peeled at 50 mm/min in accordance with JIS C 5016 to measure 90° peel strength.

Peel strength of the metal foil: similarly, peel test pieces with a width of 1.0 cm were produced, the thermoplastic liquid crystal polymer film was fixed to a flat plate with a double-sided adhesive tape, and the copper foil was peeled at 50 mm/min in accordance with JIS C 5016 to measure 90° peel strength.

Since peel strength of 0.8 kN/m or more is required in view of bending resistance etc., the samples with peel strength of 0.8 kN/m or more were considered to have satisfactory adhesion strength. The result is shown in Table 6.

<Measurement of Insertion Loss>

The produced copper-clad laminate was used to produce a 500Ω transmission line (microstrip line) that transmits electromagnetic waves therethrough. The transmission line has linear conductor foil formed on the surface of a plate-like dielectric substrate having conductor foil formed on its back surface. Insertion loss was then measured at 40 GHz with a microwave network analyzer (manufactured by Agilent Technologies, trade name: 8722ES) and a probe (Cascade Microtech, trade name: ACP40-250).

In terms of high frequency characteristics, insertion loss of −0.6 dB/10 cm or less was considered satisfactory, and insertion loss of less than −0.6 dB/10 cm was considered defective. The result is shown in Table 6.

Example 2

A copper-clad laminate was produced in a manner similar to Example 1 except that a thermoplastic liquid crystal polymer film having a thickness of 50 μm and a melting point of 280° C. (made by KURARAY CO., LTD., trade name: VECSTAR CT-F) was used and the temperature of the heating roll was set to 230° C. when forming a copper deposition layer. Thereafter, dimensional stability evaluation, peel strength measurement, insertion loss measurement, and appearance evaluation were carried out in a manner similar to Example 1. The result is shown in Table 6.

Example 3

A copper-clad laminate was produced in a manner similar to Example 1 except that rolled copper foil with a thickness of 12 μm (made by JX Nippon Mining & Metal Corporation, trade name: BHY-X, surface roughness: 1.0 μm) was used as metal foil. Thereafter, dimensional stability evaluation, peel strength measurement, insertion loss measurement, and appearance evaluation were carried out in a manner similar to Example 1. The result is shown in Table 6.

Comparative Example 1

First, a thermoplastic liquid crystal polymer film with a thickness of 50 μm (made by KURARAY CO., LTD., trade name: VECSTAR CT-Z) was prepared. Next, a copper layer comprised of a copper deposition layer and a copper plating layer was formed on both surfaces of the thermoplastic liquid crystal polymer film in a manner similar to Example 1. A copper-clad laminate having a copper deposition layer formed on both surfaces thereof was thus produced.

Thereafter, dimensional stability evaluation, peel strength measurement, insertion loss measurement, and appearance evaluation were carried out in a manner similar to Example 1. The result is shown in Table 6.

Comparative Example 2

A copper-clad laminate having a copper deposition layer formed on both surfaces thereof was produced in a manner similar to Comparative Example 1 except that the temperature of the heating roll was set to 250° C. when forming the copper deposition layers.

Thereafter, dimensional stability evaluation, peel strength measurement, insertion loss measurement, and appearance evaluation were carried out in a manner similar to Example 1. The result is shown in Table 6.

Comparative Example 3

First, a thermoplastic liquid crystal polymer film with a thickness of 50 μm (made by KURARAY CO., LTD., trade name: VECSTAR CT-Z) was prepared. Next, rolled copper was pressure-bonded to both surfaces of the thermoplastic liquid crystal polymer film in a manner similar to Example 1. A copper-clad laminate having copper foil on both surfaces thereof was thus produced.

Thereafter, dimensional stability evaluation, peel strength measurement, insertion loss measurement were carried out in a manner similar to Example 1. The result is shown in Table 6.

TABLE 6

| | Configuration of Both | | Film | Heating Roll | Dimensional Change | Dimensional Change | Peel Strength [kN/m] | | | |
|---|---|---|---|---|---|---|---|---|---|---|
| | Surfaces of Thermoplastic Liquid Crystal Polymer | Type of Copper Foil | Melting Point [° C.] | Temperature [° C.] | (Longitudinal Direction) [%] | (Lateral Direction) [%] | Metal Deposition Layer | Metal Foil | Insertion Loss [dB/10 cm] | Appearance |
| Example 1 | Copper foil/Copper Deposition Layer | BEC M2S-VLP | 335 | 280 | −0.02 | 0.05 | 0.9 | 1.2 | −0.60 | No wrinkle |
| Example 2 | Copper foil/Copper Deposition Layer | BEC M2S-VLP | 280 | 230 | −0.03 | 0.01 | 0.8 | 1.2 | −0.60 | No wrinkle |
| Example 3 | Copper foil/Copper Deposition Layer | BHY-X | 335 | 280 | −0.02 | 0.05 | 0.9 | 0.8 | −0.60 | No wrinkle |
| Comparative Example 1 | Copper Deposition Layer/Copper Deposition Layer | — | 335 | 280 | −0.10 | 0.12 | 0.9 | — | −0.60 | Wrinkles |
| Comparative Example 2 | Copper Deposition Layer/Copper Deposition Layer | — | 335 | 250 | −0.07 | 0.12 | 0.5 | — | −0.60 | Wrinkles |
| Comparative Example 3 | Copper Foil/Copper Foil | BEC M2S-VLP | 335 | — | 0.05 | 0.15 | — | 1.2 | −0.75 | — |

As shown in Table 6, in Examples 1 to 3 having a copper deposition layer on one surface of the thermoplastic liquid crystal polymer film and copper foil on the other surface thereof, no wrinkle was formed in the thermoplastic liquid crystal polymer film in the process of forming the copper deposition layer, and the dimensional change was small. Examples 1 to 3 therefore has high dimensional stability.

Insertion loss of Example 1 using electrolytic copper foil as a metal foil layer is as low as that of Example 3 using rolled copper foil. This shows that, in the present invention, a circuit board having excellent high frequency characteristics can be produced even by using inexpensive electrolytic copper foil.

On the other hand, in Comparative Examples 1 to 2 having a copper deposition layer on both surfaces of the thermoplastic liquid crystal polymer film, the metal deposition layer was formed on the thermoplastic liquid crystal polymer film by a roll-to-roll process, and therefore the thermoplastic liquid crystal polymer film was exposed to high temperatures. Accordingly, the thermoplastic liquid crystal polymer film being moved was stretched, causing strain of the thermoplastic liquid crystal polymer film and thus deteriorating dimensional stability. Moreover, since thermal strain of the thermoplastic liquid crystal polymer film had not been eliminated, wrinkles were formed in the process of forming the copper deposition layer. Such wrinkles significantly affect formation of fine pitch circuits. Particularly in Comparative Example 2, the temperature of the heating roll was as low as 250° C. when forming the copper deposition layer, which resulted in low peel strength.

In Comparative Example 3 having copper foil on both surfaces of the thermoplastic liquid crystal polymer film, the electrolytic foil formed on both surfaces of the thermoplastic liquid crystal polymer film had larger surface irregularities than the copper deposition layer (Rz=2.0). The skin effect was therefore enhanced, which resulted in insertion loss as high as −0.75 dB/10 cm and poor high frequency characteristics.

INDUSTRIAL APPLICABILITY

As described above, the present invention relates to metal-clad laminates using a thermoplastic liquid crystal polymer film and a manufacturing method of the same.

DESCRIPTION OF REFERENCE CHARACTERS

1 Metal-Clad Laminate
2 Thermoplastic Liquid Crystal Polymer Film
3 Metal Layer
4 Metal Deposition Layer
5 Metal Plating Layer
6 Metal Foil
7 Heating Roll
8 Heat-Resistant Rubber Roll
9 Heating Metal Roll
10 Continuous Heat Press Machine
12 Unwind Roll
13 Heating Roll
14 Take-Up Roll
17 Crucible
18 Electron Gun
19 Single-Sided Metal-Clad Laminate
20 Deposition System

The invention claimed is:

1. A metal-clad laminate, comprising:
   a thermoplastic liquid crystal polymer film;
   a metal deposition layer formed on one surface of the thermoplastic liquid crystal polymer film; and
   metal foil laminated to the other surface of the thermoplastic liquid crystal polymer film.

2. The metal-clad laminate of claim 1, wherein dimensional changes in a longitudinal direction and a lateral direction after heat treatment at 150° C. for 30 minutes are ±0.1% or less.

3. The metal-clad laminate of claim 1, wherein the metal deposition layer has a thickness of 0.1 μm or more and 0.5 μm or less, and the metal foil has a thickness of 2 μm or more and 18 μm or less.

4. The metal-clad laminate of claim 1, wherein a metal forming the metal deposition layer has a crystal grain size of 0.1 μm or more.

5. The metal-clad laminate of claim 1, wherein a circuit pattern is formed in the metal deposition layer.

6. The metal-clad laminate of claim 1, wherein a metal plating layer is formed on the metal deposition layer.

7. A manufacturing method of a metal-clad laminate, the method comprising:
   laminating metal foil to one surface of a thermoplastic liquid crystal polymer film to form a single-sided metal-clad laminate including the metal foil; and
   forming a metal deposition layer on the other surface of the thermoplastic liquid crystal polymer film by using a deposition system including a heating roll, while moving the single-sided metal-clad laminate by a roll-to-roll process.

8. The manufacturing method of claim 7, wherein a temperature of the heating roll is (Mp−65°) C. or more and (Mp−40°) C. or less, where Mp represents a melting point of the thermoplastic liquid crystal polymer film.

* * * * *